United States Patent
Hussey et al.

(10) Patent No.: US 10,641,820 B1
(45) Date of Patent: May 5, 2020

(54) AUTOMATED TEST EQUIPMENT WITH RELAY HOT-SWITCH DETECTION

(71) Applicant: Teradyne, Inc., North Reading, MA (US)

(72) Inventors: Alan B. Hussey, Oak Park, CA (US); Richard John Burns, Boston, MA (US); Gregory Smith, North Reading, MA (US); Mark Alan Levin, Calabasas, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 16/165,038

(22) Filed: Oct. 19, 2018

(51) Int. Cl.
*G01R 31/28* (2006.01)
*H04B 17/10* (2015.01)
*H04B 17/00* (2015.01)
*H04B 17/17* (2015.01)

(52) U.S. Cl.
CPC ..... *G01R 31/2834* (2013.01); *H04B 17/0085* (2013.01); *H04B 17/102* (2015.01); *H04B 17/17* (2015.01)

(58) Field of Classification Search
CPC .. G10R 31/2834; H04B 17/102; H04B 17/17; H04B 17/0085
See application file for complete search history.

(56) References Cited

U.S. PATENT DOCUMENTS

| | | | |
|---|---|---|---|
| 5,581,177 A | 12/1996 | Hussey et al. | |
| 6,566,890 B2 | 5/2003 | Hauptman | |
| 7,737,810 B2 | 6/2010 | Chan et al. | |
| 10,048,348 B2 | 8/2018 | Hussey | |
| 2002/0121904 A1 | 9/2002 | Hauptman | |
| 2012/0206889 A1* | 8/2012 | Norman | H01L 23/50 361/761 |
| 2015/0098164 A1* | 4/2015 | Lenig | H01H 9/56 361/185 |
| 2017/0038453 A1 | 2/2017 | Hussey | |

(Continued)

OTHER PUBLICATIONS

U.S. Appl. No. 09/798,515, filed Mar. 2, 2001, Hauptman.

(Continued)

*Primary Examiner* — Curtis B Odom
(74) *Attorney, Agent, or Firm* — Wolf, Greenfield & Sacks, P.C.

(57) ABSTRACT

Apparatus and methods for detecting and identifying a cause of a hot-switching event in an automated test system. One or more antennae positioned near mechanical relays in the system may be used to sense electromagnetic radiation. The antennae may be configured to respond to electromagnetic radiation of the type generated during a hot-switching event. Signals measured by the antennae may be processed to determine whether the signals have characteristics of hot-switching events. Processing may entail generating a signal envelope and determining whether the envelope has characteristics indicative of a hot-switching event. When a hot-switching event is detected, information to correlate the event to other events in the test system may also be captured. That information may be time information, enabling program test-system program instructions executing at the time of the event to be identified, such that the test system may be reprogrammed to avoid hot-switching events.

20 Claims, 8 Drawing Sheets

(56) References Cited

U.S. PATENT DOCUMENTS

2017/0117111 A1   4/2017   Liu et al.
2017/0162351 A1   6/2017   Zotter
2018/0204101 A1*  7/2018   De Jongh .......... G06K 19/0725

OTHER PUBLICATIONS

U.S. Appl. No. 14/819,213, filed Aug. 5, 2015, Hussey.
International Search Report and Written Opinion for International Application No. PCT/US2019/056680 dated Feb. 6, 2020.
Basu, An Experimental Investigation of Hot Switching Contact Damage in RF MEMS Switches. Thesis submitted to Northeastern University, Boston, Ma. Dec. 2013. 137 pages.

* cited by examiner

AUTOMATED TEST EQUIPMENT WITH RELAY HOT-SWITCH DETECTION

BACKGROUND

Technical Field

The technology relates to methods and structures for calibrating test channels and reliability improvement of automated test equipment (ATE).

Discussion of the Related Art

Referring to FIG. 1, a conventional test configuration 100 for semiconductor devices may include automated test equipment (sometimes referred to as a "tester" or an "ATE"). Tester 110 may include tester resources, sometimes called instruments, that generate or measure test signals. Within the tester, the tester resources are connected to channel contacts forming a tester interface 131. Each channel contact may be connected to a test point on a device under test 150 through a device interface.

The nature of the device interface may depend on the specifics of the device under test. In some implementations, the device under test 150 may be a wafer while in other implementations the device under test may be one or more packaged integrated circuits. These differences enable the same tester 110 the ATE to be used for testing integrated circuit devices on a wafer prior to dicing the wafer or for testing the integrated circuits after they have been packaged. For testing packaged devices, the device interface may be a device interface board 135, as illustrated in FIG. 1. But other device interfaces, including, for example, a probe card for making connections to a wafer for testing, may be used in other implementations.

Thus, by changing the device interface, the same tester 110 may be used to test integrated circuits at different stages in their manufacture. Moreover, a tester 110 is programmable and can test different types of devices that require different types of test signals to be generated or measured to determine whether the device under test is operating properly. Even during the test of a device under test, different types of test signals may be generated or measured at different times.

To support these different test requirements, a test configuration 100 may include relays that may be opened or closed to selectively connect specific tester resources to test points on a device under test. Tester 110 may be programmable such that execution of test system instructions, programmed into the tester 110 for performing specific tests on specific devices, control the state of the relays so that appropriate tester resources are connected to appropriate test points.

Often, the relays are mechanical relays because such relays provide a very low on resistance as a result of metal contacts in the relay touching each other when the relay is closed. However, mechanical relays are susceptible to damage as a result of a phenomenon known as "hot-switching." Hot-switching occurs when a relay is opened or closed while a voltage exists across the contacts within the relay. During hot-switching, the contacts inside the relay touch as they are closing, which will generate a high amount of current and in turn, heat that can damage the contacts.

Hot-switching may unintentionally occur in a test system as a result of the way a test program is written. An instruction in the program, changing the state of a relay, may execute at a time when a voltage exists across the relay, for example when one or both of the relay contacts are connected to voltage source(s).

SUMMARY

The inventors have recognized and appreciated that reliability of a test system may be increased by providing a mechanism to detect hot-switching. A detected hot-switching event may be correlated to a test system program instruction that triggered the hot-switching, such that the test system can be reprogrammed to avoid hot-switching and consequent damage.

In accordance with some aspects, a method may be provided for detecting mechanical relay hot-switching events in a test system comprising a plurality of relays at corresponding relay locations. The method may comprise measuring, with one or more antennae, one or more signal waveforms representing electromagnetic emissions from one or more relays of the plurality of relays. The one or more signal waveforms may be analyzed to determine whether at least one of the one or more signal waveforms has a characteristic associated with a hot-switching event. Based on determining that at least one of the one or more signal waveforms has a characteristic associated with a hot-switching event, identifying a time corresponding to the hot-switching event.

In accordance with some aspects, a test system may be provided. The test system may comprise a printed circuit board (PCB) and a plurality of relays arranged on the PCB. One or more antennae may be disposed adjacent one or more relays of the plurality of relays, such that each of the one or more antennae is configured to measure one or more signal waveforms representing electromagnetic emissions from the one or more relays. Circuitry may be provided and configured to analyze the one or more signal waveforms to determine whether at least one of the one or more signal waveforms has a characteristic associated with a hot-switching event.

In accordance with yet other aspects, a method of operating a test system to detect hot-switching events may be provided. The method may comprise controlling switching of relays of a plurality of relays in the test system in accordance with a plurality of instructions. One or more signal waveforms representing electromagnetic emissions from one or more relays may be measured with one or more antennae. The one or more signal waveforms may be analyzed to determine whether at least one of the one or more signal waveforms has a characteristic associated with a hot-switching event. Based on determining that at least one of the one or more signal waveforms has a characteristic associated with a hot-switching event, one or more instructions of the plurality of instructions may be identified as a cause for the hot-switching event.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated, simplified, and/or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

Figure 1:
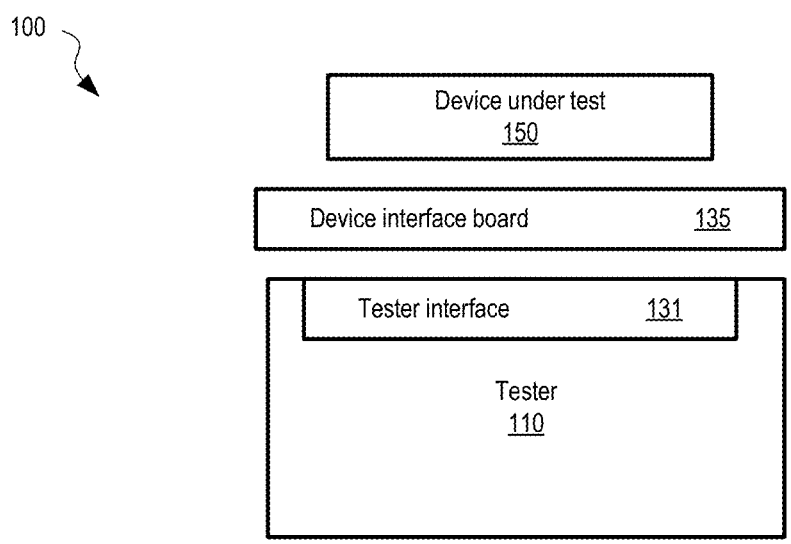
FIG. 1 is a block diagram depicting components associated with an automated test equipment, according to some embodiments.

The features and advantages of the embodiments will become more apparent from the detailed description set forth below when taken in conjunction with the drawings.

DETAILED DESCRIPTION

The inventors have recognized and appreciated that an automatic test system may be imparted with longer and/or more reliable operation by incorporating components to detect hot-switching events. Those components may enable correlation of a hot-switching event to one or more program instructions in a test program that may have caused the hot-switch. Further, the magnitude of the hot-switching event may be determined. The output of a system with such components may be used to impact operation of the test system, such as by modifying the order of instructions in a program to avoid hot-switching or to avoid hot-switching above a predetermined magnitude associated with rapid failure of relays.

The inventors have also recognized and appreciated circuit designs with a size and cost that make it feasible to detect very short duration hot-switching events in an automatic test system. The components, for example, may be sufficiently compact to fit between boards in a conventional automatic test system without impacting performance of the test system. Suitable circuits may include antennae that "ring" in response to pulses of electromagnetic radiation emitted during hot-switching. Additionally circuitry, coupled to the output of such an antenna, may output an envelope signal of the ringing. The envelope signal, when present, may indicate a hot-switching event, but will be much longer in duration, and therefore easier to detect and process with compact circuitry, than the electromagnetic pulse emitted by a relay during hot switching.

The components for hot-switch detection may include one or more antennae positioned near relays that may be susceptible to hot-switching. Components to analyze the signals picked up by the antennae may also be included. The analysis circuitry may include a processor, which may be implemented as a Field Programmable Gate Array (FPGA) or other hardware circuitry, which may process a measured signal to determine when a signal includes one or more characteristics associated a hot-switching event. In some embodiments, the analysis circuitry may additionally determine which relay was hot-switched and/or the magnitude of the hot-switching.

Further, analysis circuitry may include a component that enables correlation of a detected hot-switching event with other events within the test system. In some embodiments, a hot-switching event may be correlated to execution of program instructions that control operation of the tester. For example, a hot-switching event may be correlated to an instruction that controls a relay. In some embodiments, that correlation may be performed by recording in computer memory information about the time of occurrence of the hot-switching event. In subsequent processing, instructions executing at the time of the event may be identified. As a specific example, operation of the test system may be synchronized with respect to common timing signals that track time with respect to a start of a test or other suitable event. The time of an event, including detection of a hot-switching event or execution of a test system instruction, may be reflected as a time stamp derived from the common timing signals. In this way, recording a time stamp in connection with an indication that a hot-switching event may enable later processing to identify a program instruction or instructions with the same or similar time stamp as a cause of the hot-switching event.

The relays for which hot-switching may be detected may be any relays susceptible to hot-switching, such as mechanical relays that operate under program control and across which a voltage source can be connected as part of execution of a test on a device under test. The relays may be in any portion or portions of the test configuration. They may be, for example, in a body of the tester, coupling inputs or outputs of instruments to specific channel contacts in a tester interface. The relays may be concentrated in a relay matrix or may, in some embodiments, be distributed throughout the test system. Alternatively or additionally, the relays may be in a device interface board or otherwise included in a device interface, as the techniques described herein may be applied regardless of the components of the test system in which the relays are installed.

In some embodiments, the antennae may be positioned and oriented with respect to the relays such that they will receive electromagnetic radiation emitted by the hot-switching. The antennae, for example, may be implemented as dipoles, spirals or other patch antennae on a printed circuit board (PCB) on which the relays are mounted. Alternatively, or additionally, the antennae may be implemented on one or more separate PCBs or other substrates mounted near the relays.

The inventors have recognized and appreciated that because hot-switching events are associated with a short duration, for example 75 ps or shorter before the voltage difference across the relay contacts decreases, the resulting radiation energy spectrum extends to frequency components that may be higher than 3.5 GHz and may stimulate antennae with a resonant frequency lower than 3.5 GHz. The antennae, for example, may be tuned to a frequency in the range of 1-5 GHz, for example, of 2-3 GHz, or 2.2 GHz in some embodiments. According to an aspect, the antenna length can be sized larger to increase coverage area or shorter as a high-pass filter that may exclude other lower frequency interference. In some embodiments, the antennae are tuned to a frequency above a minimum frequency of the an envelope detector circuitry.

The output of the antenna may be measured and further processed to determine whether a resonant signal associated with a hot-switching event is present. That processing may include, in some embodiments, amplifying the signal at the output of the amplifier. Other processing may be performed. As an example, the amplified signal may be gain adjusted, such as with an attenuator or other suitable gain control circuit. The resulting signal may be processed to detect an envelope of the signal.

In some embodiments, the envelope detector circuitry may be configured to discriminate signals characteristic of a hot switching event. The envelope detector, for example, may produce an envelope of a component of a signal output by the antenna at the ringing frequency of the antenna that would be excited by electromagnetic radiation emitted by a relay that is hot-switching. Alternatively or additionally, the envelope detector circuitry may gate the output of an envelope signal based on the duration or other characteristics of that envelope being consistent with a signal generated by hot-switching.

Characteristics of the envelopes produced from signals output by one or more antennae, such as peak amplitude, duration, and/or pattern of peaks, may be compared to known characteristics of signals known to indicate a hot-switching event to derive additional information about the hot-switching. That additional information may include which relay hot-switched. Alternatively or additionally, the voltage across the relay that hot-switched may be computed to assess the magnitude of the hot-switching.

Relevant characteristics may be determined in any suitable way. For example, measurements may be made under conditions in which hot-switching is intentionally introduced. Characteristics of signals detected under these known conditions can serve to calibrate the processing apparatus to detect hot-switching at other times. Calibration values may be used, for example, to determine an expected signature of signals received at each of multiple antennae when a specific relay has hot-switched. By comparing the signals received at multiple antennae to signatures for each of multiple relays, a determination can be made of which relay gave rise to a detected hot-switching and the hot-switching voltage across the relay at the moment of the hot-switching. Such a comparison may alternatively or additionally be used to confirm whether a hot-switching event occurred.

Some or all of the processing may be performed digitally. In some embodiments, the envelope may be sampled and then digitized. Selected digitized samples may be captured as a representation of an event. For example, a number of digital values may be captured for subsequent processing to determine which relay gave rise to that hot-switching event and/or determine the magnitude of the hot-switching event.

The components for processing signals measured by the antennae may be in any suitable form and may be located in any suitable place within the test configuration. Some or all of the components, for example, may be on the same PCB as the antennae or may be on a separate printed circuit board connected to the antennae via one or more cables or other suitable interfaces. In other embodiments, some of the processing components may be outside the tester, such as in a computer coupled to the tester through a wired or wireless interface. By way of example, and not of limitation, components for processing signals from the antennae within the tester may generate digital representations of the waveforms that may be transferred to a separate computer outside the tester for further processing to identify a cause of hot-switching event.

These techniques may be incorporated, alone or in any suitable combination, into a test configuration, such as the test configuration shown in FIG. 1. An exemplary implementation of such a test system having a relay matrix assembly is shown in FIGS. 2A, 2B.

Figure 2A:
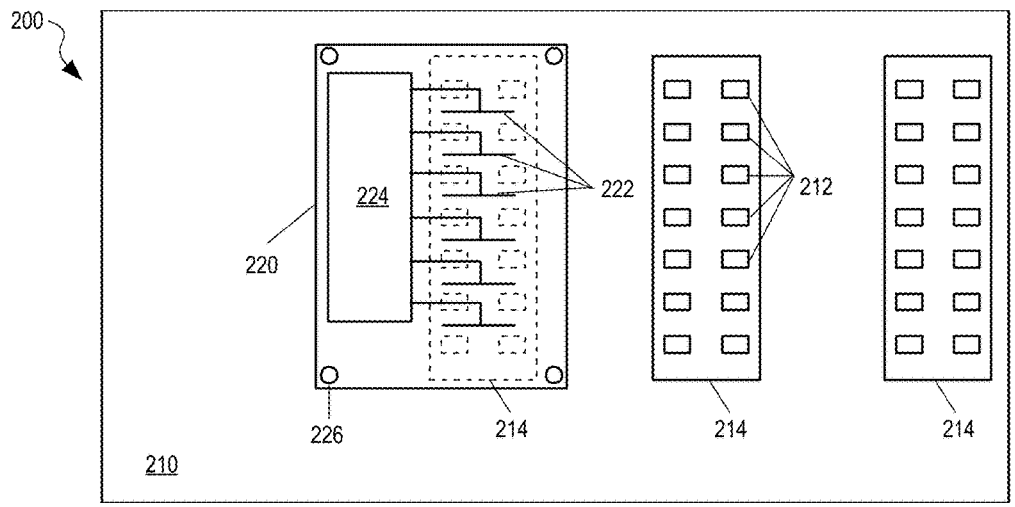
FIG. 2A is a plan view of an assembly, including relays, and antennae configured to receive electromagnetic signals emitted by the relays during hot-switching, according to some embodiments.
Figure 2B:
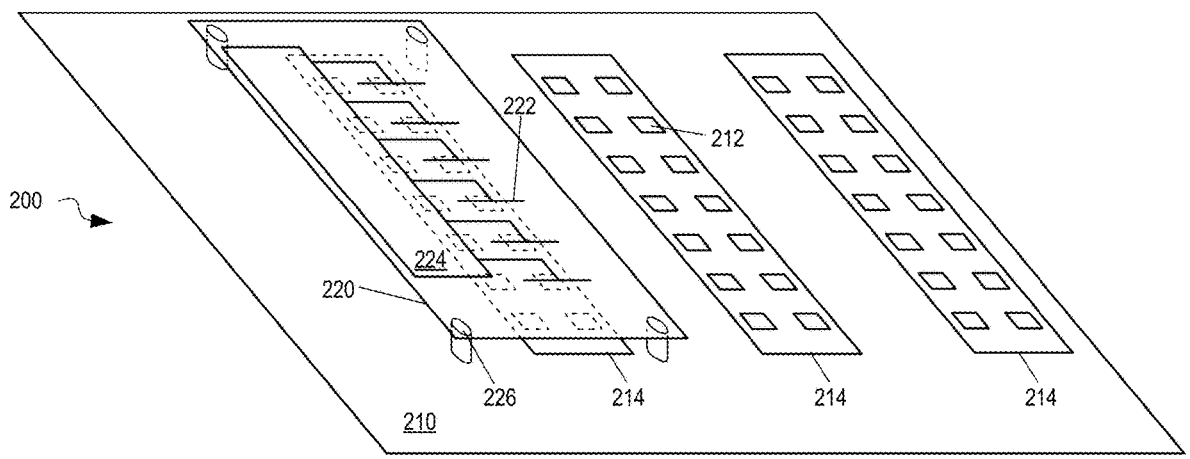
FIG. 2B is an isometric view of the assembly in FIG. 2A, according to some embodiments.

FIG. 2A depicts an assembly 200 including relays for insertion in a tester, according to some embodiments. Assembly 200 may represent any suitable portion of a test system. It may represent, for example, an analog or digital instrument that generates or measures analog or digital signals under program control while tester 110 executes a test. Accordingly, assembly 200 may have components, not expressly shown, that provide tester resources for generating and measuring signals that pass through the relays. However, relays in a test system need not be on the same assembly as the tester resources, and assembly 200 may simply be a switch matrix that is connected to other assemblies implementing tester resources.

In the embodiment illustrated, assembly 200 comprises a plurality of relays 212 arranged on a surface of a board 210. Relays 212 are arranged in two-dimensional arrays on the surface of board 210 to form part of one or more relay modules 214. While FIG. 2A illustrates three relay modules 214, each having a matrix of 14 relays 222, it should be appreciated that such arrangement is by way of example only, and any suitable arrangement of relays on the board 210 may be provided.

Electric inputs (not shown) to relays 212 in the relay modules 214 of assembly 200 can be switchably connected to test points on a device under test 150 (FIG. 1). In some embodiments, assembly 200 may be mounted within tester 110 (FIG. 1) so that inputs on the relay matrix assembly electrically connect to tester channel contacts exposed at tester interface 131. By switching the relays within the relay matrix assembly, a selected tester channel contact may be quickly connected to a tester resource to generate or analyze test signals. In some embodiments, board 210 may be a multi-level PCB. Relays 212 may be arranged on either or both surfaces of the board 210.

Assembly 200 may be physically integrated into test configuration 100 in any of multiple ways. In some embodiments, board 210 may have a number of contacts arranged in a pattern that physically matches to a distribution of tester channel contacts at the tester interface 131. In such an embodiment, the assembly 200 may be attached to a tester interface 131, and electrical connection may be made to each of the tester channel contacts on the tester head through the input contacts of the assembly 200.

Figure 2C:
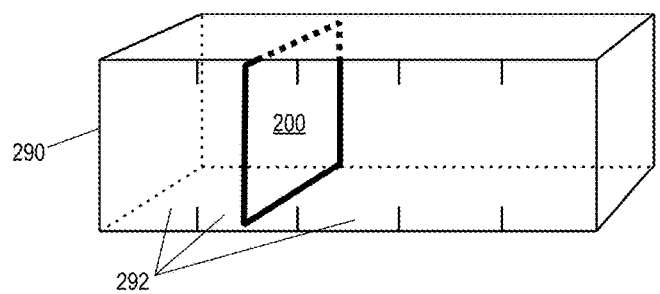
FIG. 2C is a schematic illustration of the assembly of FIG. 2A installed in a body of a tester.

In other embodiments, and as depicted in FIG. 2C, assembly 200 may be a channel card or other instrument installed in one of a plurality of slots 292 of a test system enclosure 290. In such an embodiment, contacts on board 210 of the relay matrix assembly may be arranged to be electrically and mechanically coupled to corresponding contacts within the slot 292. These contacts may, in turn, be connected to other assemblies mounted in other slots 292 and/or other components inside or outside tester 110, such that power, ground reference voltage, analog and digital test signals, as well as control signals may be communicated between assembly 200 and other components of the tester configuration 100. In some embodiments, slot 292 of test system enclosure 290 may provide connection to one or more buses in accordance with any suitable communication techniques. The buses may configured to carry power, ground reference voltage, analog and digital test signals between assembly 200 and other components so as to enable the functions described herein to be performed.

One such other component is a timing component that synchronizes operation of the other components. In accordance with some embodiments, timing components may distribute timing signals to all of the assemblies in slots 292 and/or other components such that the components may operate in a coordinated manner during a test of a device under test. As a specific example, some components may execute test systems instructions as part of a test program loaded into tester 110. The instructions may be executed at times defined by tester cycles. For example, one instruction may be executed per tester cycle. The tester cycles may be numbered consecutively from a start event, such as the start of a test, and this numbering may create a time stamp for each instruction. As other components similarly have access to these timing signals, the timing of other events triggered or detected by other components can similarly be indicated relative to these timing signals, including the time stamps. As described below, the timing of detected hot-switching events may be indicated in this way Referring again to FIG. 2A. Relays 212 may be mechanical relays with opposing contacts that close or open in response to control signals received at contacts on the relay matrix assembly. Hot-switching in a relay may occur when opposing contacts within the relay are closed and/or opened while a voltage difference exists across the opposing contacts. Components may be integrated into test environment 100 to detect such hot-switching and output information on the cause of a hot-switching event. Those components may include antennae to receive and respond to electromagnetic radiation emitted by a relay that is hot-switched.

As shown in the exemplary assembly 200 in FIG. 2A, a plurality of antennae 222 are positioned adjacent the relays 212 within relay module 214, and oriented to receive electromagnetic radiation emitted by hot-switching within the relay module 214. Any suitable form of antennae may be used. For example, the antennae may be implemented as dipoles, spirals or other patch antennae on a printed circuit board (PCB) on which the relays are mounted. It should be appreciated that while six antennae are shown in FIG. 2A, six is not a requirement. Any number of antennae, including a single antenna, may be placed adjacent one or more relays to detect hot-switching events. Antennae may be placed adjacent a portion, or all of the relays on board 210. For example, while FIG. 2A illustrates antennae only adjacent one of the relay modules 214, it should be appreciated such illustration is by way of example of only and that additional antennae may be provided.

The antennae may be arranged in any suitable distance and orientation for picking up hot-switching electromagnetic radiation emissions within the relays. For example, the antenna may be oriented such that a long axis of the antenna is parallel to a long dimension of a relay under test, which may correspond to an elongated dimension of the contacts where they contact inside the relay. In some embodiments, the antenna may be a dipole antenna having a long axis with an angle of up to 45° from, and preferably aligned with the current signal direction across a relay. The antennae may be mounted on any suitable substrate that is near the relays, including on PCB 210, itself. However, in the embodiment illustrated, the antennae are mounted on a separate PCB.

FIG. 2B is an isometric view of the assembly in FIG. 2A, according to some embodiments. FIGS. 2A and 2B illustrate an exemplary embodiment where antennae 222 are arranged on a surface of PCB 220 that is parallel and facing the surface of board 210 where relay modules 214 are located. Arranging the antennae generally in a plane parallel to the surface of board 210 may allow an antenna to be sensitive to electromagnetic emissions from more than one relays on the surface of the board 210. Arranging PCB 220 to be parallel to board 210 may also reduce the overall package thickness of the relay matrix assembly in a direction normal to the surface of board 210. For example, board 210 may be kept close to PCB 220 such that the assembly 200 may still fit within a slot 292 of the test system enclosure 290, without interfering with components located in adjacent slots, either electrically or mechanically. Any suitable method may be used to couple PCB 220 to board 210. For example, the assembly 200 may include couplers 226 as shown in FIGS. 2A, 2B. Couplers 226 may be mechanical fasteners, while any suitable techniques may be used to couple 220 to 210, such as but not limited to coupling by adhesive, soldering, or wafer bonding.

In some embodiments, PCB 220 may also include a circuitry 224 that is coupled to antennae 222, as shown in FIG. 2A, 2B. Circuitry 224 comprises components that receive and process signals from antennae 222. The components may be configured to perform analog processing, such as noise reduction, signal attenuation, amplification, filtering, and envelope detection; and digital processing such as digitization or pattern matching. Other processing may also be performed.

While not shown, PCB 220 may include traces and contact points such as pads for circuitry 224 to be connected electrically with components on board 210 or external to the assembly 200. The communication may include power and ground reference voltage, analog and digital signals, as well as control signals. The specific mechanism for that electrical communication is not critical to the invention. Electrical connectors, for example, may connect PCB 220 to PCB 210, such that electrical signals may be coupled through the interfaces between PCB 210 and other components within the test system. Alternatively or additionally, interfaces may be provided from PCB 220 to other components, such as through cables or other suitable connection technologies.

Electrical communication between antennae 222 and other components of tester 110 enables processing of signals from antennae 222 to be performed in any suitable location. In some embodiments, at least some analysis is performed within circuitry 224 similarly mounted to PCB 220.

Figure 3:
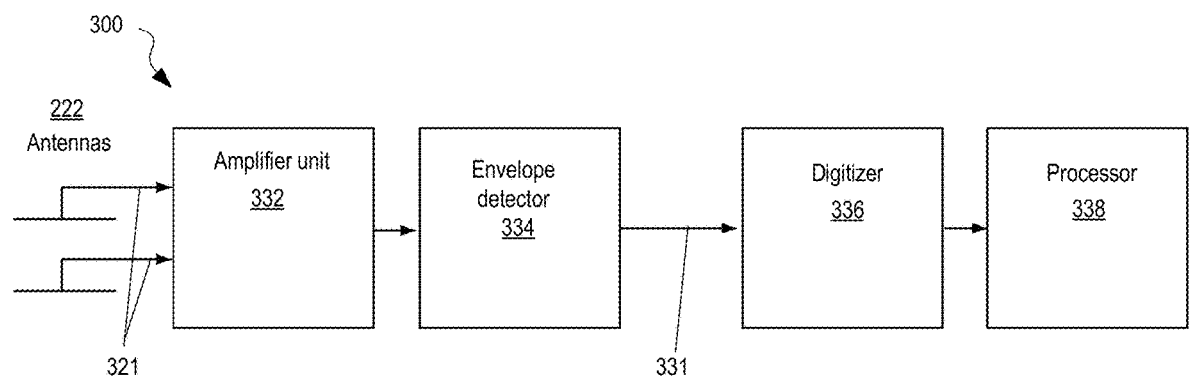
FIG. 3 is a block diagram of analysis circuitry that analyzes signals received from the antennae to determine whether at least one of the one or more signal waveforms has a characteristic associated with a hot-switching event, according to some embodiments.

FIG. 3 depicts an analysis circuitry 300, some or all of which may be within circuitry 224 or in any other suitable location, that analyzes signals received from the antennae to determine whether at least one of the one or more of the antennae is outputting a signal waveform that has a characteristic associated with a hot-switching event, according to some embodiments. As shown in FIG. 3, signal waveforms 321 generated at one or more antennae 222 may be amplified at the output of an amplifier unit 332. Other processing may be performed by amplifier unit 332. For example, the amplified signal waveforms may be gain adjusted, such as with an attenuator or other suitable gain control circuit.

The resulting signal waveforms may be processed at an envelope detector 334 to detect an envelope 331 of a ringing signal, as would be induced in an antenna exposed to electromagnetic radiation from a hot-switching relay, in the time domain. In some embodiment, the envelope detector may be configured to discriminate a hot-switching induced ringing signal from noise based on characteristics of the envelope, such as its duration, peak amplitude, and/or pattern of peaks as compared to known characteristics of signals known to indicate a hot-switching event. Relevant characteristics may be determined in any suitable way. In some embodiments, the envelope 331 may be sampled and then digitized at a digitizer 336. Selected digitized samples may be captured as a representation of a hot-switching event and these digitized samples may be analyzed at one or more processor 338 to determine whether the captured event is a hot-switching event. For example, when an output of an envelope detector indicates a hot-switching event occurred, a number of digital values, representing a time window around the event, may be captured for subsequent processing. The subsequent processing may determine which relay hot-switched, compute the magnitude of the hot-switching or serve other purposes, such as to confirm that the event was a hot-switching event.

In some embodiments, one or more components of the analysis circuitry 300 shown in FIG. 3 may be arranged on the PCB 220 and coupled to antennae 222 as shown in FIG. 2. For example, amplifier unit 332 and envelope detector 334 may be disposed on the same PCB and close to antennae 222, to reduce noise and attenuation in the measured signal waveform. Processor 338 may be external to the PCB 220 and coupled to an output of circuitry on PCB 220 by conductors such as wiring or cables, although such arrangement is not a requirement. Digitizer 336 may be located on a separate assembly with process 338 or may be located on PCB 220, depending on whether the signals area communicated in analog or digital form from PCB 220. It is not a requirement that the components of analysis circuitry 300 be located on any specific assembly. In some embodiments, all the components of analysis circuitry 300 including digitizer 336 and processor 338 may be disposed on the PCB 220 to reduce component foot print and increase signal to noise ratio.

Figure 4:
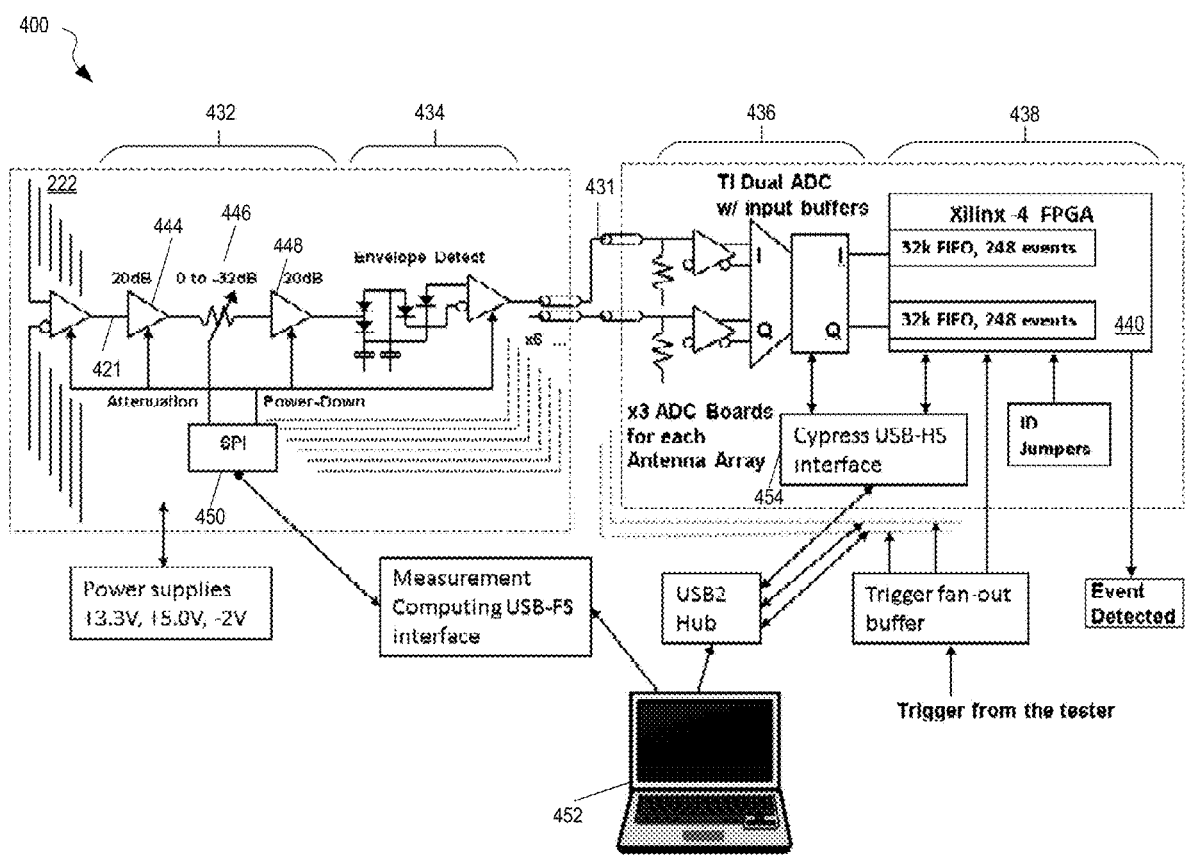
FIG. 4 is a simplified schematic diagram of an exemplary implementation of analysis circuitry, according to some embodiments.

FIG. 4 depicts an exemplary implementation of analysis circuitry 300, according to some embodiments. In FIG. 4, signal waveforms 421 picked up at one or more antennae 222 may be amplified at an amplifier unit 432 configured to process and amplify electromagnetic signal waveforms that are characteristic of a hot-switching event.

The inventors have appreciated and recognized that during hot-switching in a relay having opposing metal contacts with a voltage across, the metal contacts may approach each other at a rate of for example approximately 8 atom diameters per nanosecond. While the contacts are closing in, asperities on opposing surfaces of the contacts become vaporized until sufficient asperities are molten or through other processes that may happen during such events such that an electrical connection can be completed and held in the two contacts to reduce the voltage across. Such a "hot" connection process tends to generate a short, ≤75 ps duration connection that may cause an electromagnetic voltage gradient and magnetic field having high frequency components which is captured by one or more of the antennae adjacent the relay. The antennae, in response, initiate a voltage oscillation at a tuned resonance frequency with an amplitude that decays over time. Such oscillation is referred to as "ringing," and the tuned frequency of the antenna is referred to as a ringing frequency.

According to an aspect of the present application, the antennae 222 may be tuned to be more sensitive to electromagnetic radiations from relay hot-switching events, compared to electromagnetic signals that are not related to hot-switching. The antennae may have a ringing frequency in a range that overlaps the frequencies of electromagnetic radiation from hot-switching events, while the range is outside of frequencies of signals propagation in components of the test system. The ringing frequency may be between 1-5 GHz. In the example shown in FIG. 4, the antennae are configured such that the ringing frequency is 2.2 GHz, which is above the frequency of propagating signals in the test system components. In such a configuration, the antennae may selectively generate signal waveforms representing the short duration electromagnetic radiations from hot-switching events, while being relatively insensitive to other signals, thereby reducing false positives.

Other techniques may alternatively or additionally be used to increase the ability of the antenna and/or other circuitry to discriminate electromagnetic radiation associated with a relay hot-switching. For example amplifier unit 432 or additional circuitry (not shown) to may be used to provide selective screening on the received electromagnetic radiation, for example by rejecting noise signals or signals having relatively amplitude lower than a noise threshold, such that signal waveforms 421 are selectively generated to represent hot-switching events that occur in the relays. Based on the measured signal waveforms, aspects of the present application may provide a determination of the timing and/or relay location responsible for one or more hot-switching events, and in turn identify the one or more instructions in the test program as a cause for the hot-switching events.

The inventors have recognized and appreciated that the signal waveforms with ringing frequency on the order of multiple GHz would require large, complex and/or expensive high-bandwidth electronic components for further processing, and that a signal down conversion may be provided to generate a lower bandwidth representation of the signal waveforms. In one aspect, a signal envelope may be generated with an envelope detector, such as envelope detector 334 as shown in FIG. 3 for each single waveform. The envelope detector may generate an envelope of the component of the output of the antenna representative of the antenna "ringing" excited by a relay hot-switching. FIG. 4 illustrates another exemplary embodiment with an envelope detector 434.

In the embodiment shown in FIG. 4, relay hot-switching related emission induces a signal waveform 421 of antenna 222, amplified with an amplifier 444, gain adjusted with an attenuator 446, further amplified with another amplifier 448 and sent to an envelope detector 434, which generates a representation of the envelope of the ringing signal. In the illustrated embodiment, that representation may be a pulse 431 representing a signal envelope of the ringing signal waveform 421. Pulse 431 may have an amplitude that varies in proportion to the amplitude of the signal envelope. Pulse 431 may have a pulse width sufficient to enable detection of the ringing signal with relatively compact and low cost circuitry in comparison to circuitry required to detect a much shorter pulse of electromagnetic radiation emitted by a relay hot-switching. The pulse width of the envelope of the ringing signal, for example, may be between 1 and 20 ns. For example, the pulse width may be 2 ns or more.

Thus the envelope detector 434 provides a greater than 2 ns wide pulse in the signal envelope based on the fast ringing signal waveforms 421 from antennae 222. This represents a pulse widening of more than 20 times compared to the short, ≤75 ps radiation pulse radiation in the hot-switching event. Such pulse widening may present several advantages. For example, the wide pulse of the signal envelope may be relatively easily digitized without requiring expensive and complex circuitry. In some embodiments when the analysis circuitry 300 shown FIG. 4 is implemented as part of assembly 200 in the form of a channel card as shown in FIG. 2C, the wide, 2 ns or more pulse width of the signal envelopes generated by the envelope detectors may be transmitted easily out of the confined space between slots 292 using a suitable lower bandwidth technique. For example, flexible cables may be used without the need for relatively complex and bulky transmission lines.

In the embodiment illustrated, the envelope signal is further processed in digital form. In this embodiment, each pulses 431 is sent to an Analog to Digital Convertor (ADC) 436 to be digitized at a sampling rate that provides a sufficient number of samples for further analysis of the pulse in digital form. In some embodiments, the signal envelopes are sampled at the ADC at a sampling period between 0.1 ns and 1 ns. As a specific example, sampling may generate 1.8 GS/s.

The digitized pulse waveform is received by a processor, in this example implemented within an FPGA, which analyzes the signal envelope within the digitized pulse waveform to determine characteristics associated with hot-switching events. As shown in FIG. 4, multiple antennae may be present in a test system, each having a different position relative to relays being monitored for hot-switching. The outputs of each antenna may be processed as described above to generate an envelope of a ringing signal when a hot-switching relay is close enough to that antenna to induce such ringing. As a result, there may be one or more envelope signals for each hot-switching event. Characteristics of the detected envelope signals may be used for further processing, such as to determine which relay hot-switched, confirm that hot-switching occurred or compute the magnitude of the hot-switching event. For such processing, characteristics of the signal envelopes, such as peak amplitude, pulse duration, pulse width, and/or pattern of peaks may be compared to known characteristics of signals known to indicate a hot-switching event.

If hot-switching is detected, the FPGA may output an indication that the hot-switching event was detected. This information may be provided in a format that enables further processing in response to an indication of the hot-switching event, such as correlation to a test system instruction that caused the hot-switching event.

In the illustrated embodiment, the FPGA may store information about hot-switching events detected during a test and provide an indication of these events after the test is concluded at other convenient time. This indication may include information indicating the timing of the event. Accordingly, the FPGA may be configured to assign a time-stamp and/or save a record of the signal envelop representing the hot-switching event. When the measurement period is complete the saved signal envelops may be transferred to an external processor, such as a computer 452 via an interface 454.

Other information may alternatively or additionally be provided for processing. Signal waveforms having high frequency resonances may also be saved and transferred to computer 452 via an interface 450. The computer 452 may reconcile the time-stamp aligned events, as well as location of antennae to identify a relay location corresponding to the hot-switching event. Further processing may also be provided to identify a program instruction or instructions with the same or similar time stamp as a cause of the hot-switching event.

Aspects of the present application are directed to analyzing a signal waveform output by the antennae to determine whether at least one of the one or more signal waveforms has a characteristic associated with a hot-switching event. Examples of such analysis are described below with reference to FIGS. 5 and 6.

Figure 5:
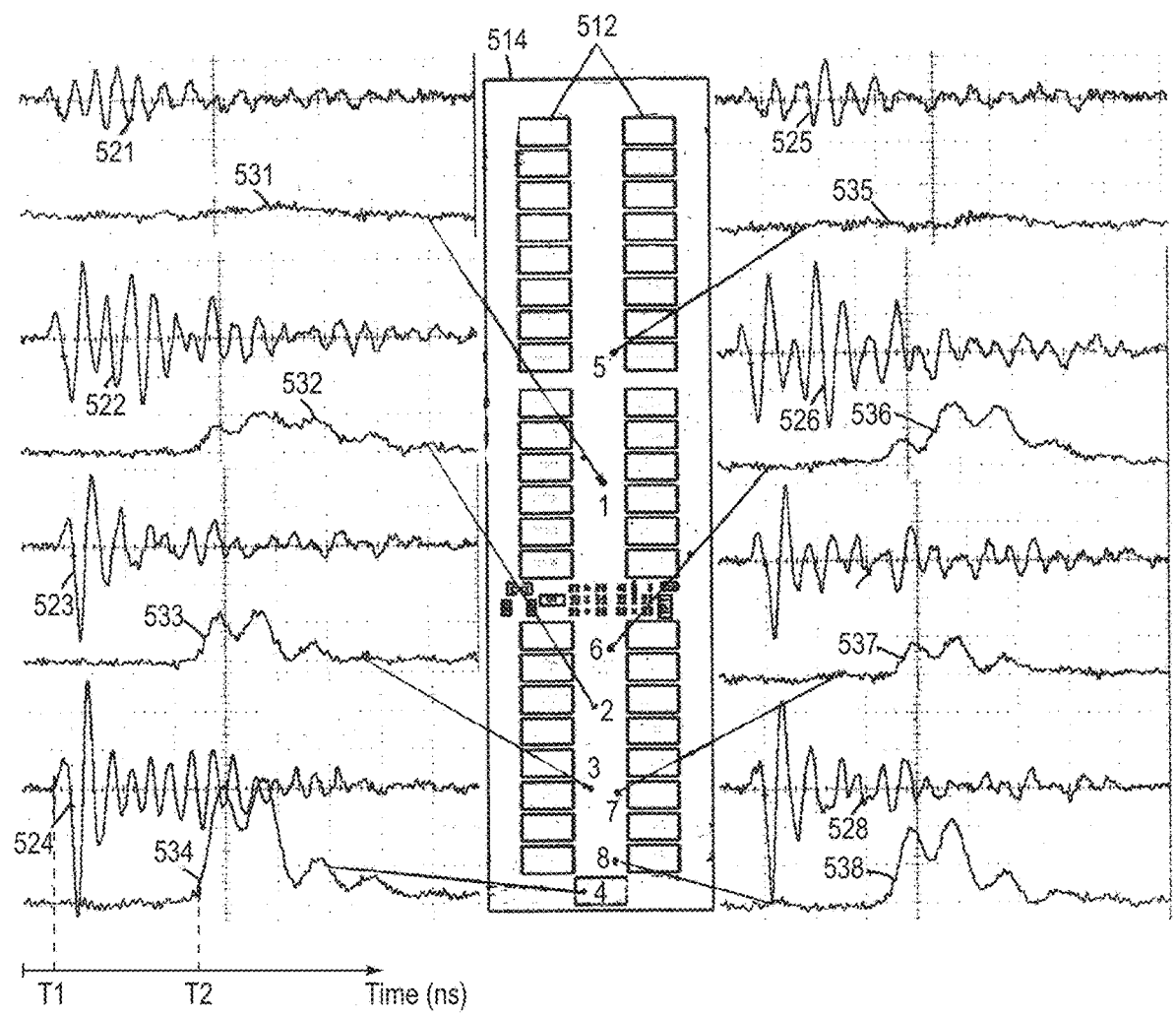
FIG. 5 is a collection of signal waveforms and their corresponding envelope signals as measured by antennae placed at different locations of a relay module, according to some embodiments.

FIG. 5 depicts a collection of signal waveforms and their corresponding envelope signals as a result of signals received by antennae (not shown) placed at different locations of a relay module 514, according to an embodiment of the present application. Relay module 514 comprises a plurality of relays 512. A test program, or test job comprising a plurality of instructions, including instructions to close or open relays in the relay module 514, is executed by a computer. Signal waveforms 521, 522 . . . 528 are time domain voltage waveforms produced at the output of the antenna when the antenna was placed above locations 1, 2 . . . 8 of relay module 514, respectively. Signal envelops 531, 532 . . . 538 are the detected envelopes of signal waveforms 521, 522 . . . 528, respectively, using for example an envelope detector as discussed above in FIGS. 3 and 4.

Using signal waveform 524 and signal envelop 534 as an example, at time T1, a ringing oscillation is "kicked off" as shown in waveform 524. At time T2, a pulse 534 begins in the corresponding signal envelop 534. The ringing oscillation in signal waveform 524 indicates that a hot-switching event has occurred in the vicinity of location 4, where waveform 524 is measured. It should be appreciated that although FIG. 5 shows T2 as having a delay from T1, the delay may be for illustration purpose only, and has no bearing on using the time value of T2 as a time stamp for signal envelope 534. More generally, envelopes from signals output by each of multiple antennae detected close tougher in time may be regarded as associated with the same hot-switching event. Those envelopes may therefore be assigned the same time stamp, which may be assigned based on the time of occurrence of just one or multiple of such envelope signals.

Antennae near locations 2, 3, 6 and 7 as shown in FIG. 5 are located close to location 4, and signals from a relay near location 4 may be picked up by those antennae. Other processing may be performed when signals picked up from multiple antennae indicate hot-switching to determine which relay experienced a hot-switching event. In a simple example, the signal envelope picked up with an antenna at location 4 has the largest peak amplitude in about the same time frame around any of the signal envelopes picked up with locations 2, 3, 6 and 7, which may be an indication that a relay located closer to location 4 than locations 2, 3, 6 and 7 is responsible for the signal envelope at time stamp T2. Signal envelope 534 may then be selected for further processing as representing hot-switching in such a relay. However, an antenna—though close to a relay—may be on the opposite side of the PCB from the relay or otherwise separated from the relay by components that attenuates to the effect of the radiation from hot switching on an antenna. The inventors have recognized that there can be wide variability of peak amplitude by the closest antenna to a relay that hot-switched. Accordingly, other information may be used in combination with envelope information to determined which relay hot-switched. As another example, other information, such as program instructions executed at the time may be used to determine which relay had a hot-switching event.

In other embodiments, the location of a relay having a hot-switching event may be identified in other ways. For example, the magnitude of multiple peak amplitudes in signal envelopes at various locations may act as a signature characterizing a particular relay. Such patterns may be identified by measuring signals as part of a calibration process when hot-switching is intentionally induced. Once the pattern of peak amplitudes of the envelopes of ringing signals from multiple antennae is determined, it may be compared to pre-stored patterns similarly measured when each of multiple relays was intentionally hot switched during a calibration phase. As a specific example of such a comparison, a pre-stored pattern with the highest correlation to the measured pattern of envelopes of ringing signals during a hot switching event may be selected. The relay associated with the selected pre-stored pattern may be indicated as the relay undergoing hot-switching.

It should be appreciated that any reasonable measurable indication of a hot-switching event may be selected as a characteristic associated with a hot-switching event. More than one type of characteristics may also be used in combination. For example, some relays will generate more than one pulse in the signal envelope during hot-switching events, due to asperities in opposing relay contacts first becoming vaporized, and later followed by a more complete connection for a second time, while a voltage exists across the contacts. Such behavior may manifest in two or more pulses in the signal envelopes, each pulse separated by a relatively long period of pulse interval, such as 3-50 ns. Patterns as such in signal envelopes may be used as a characteristic sign of hot-switching events and may be used alone or in addition to other characteristics associated with hot-switching.

In some embodiments, peak amplitude in one or more detected signal envelopes may indicate a magnitude of the relay hot-switching event. For example, once a relay is identified as the source of hot-switching has been detected, the magnitude of a signal envelope at an antenna may be compared to a pre-stored magnitude of a signal envelope similarly measured when hot-switching was intentionally induced in that relay during a calibration phase. The ratio between the measured magnitude and the pre-stored magnitude may serve as a scale factor. During the calibration phase, the relay may have a known voltage across it during hot-switching. To determine the magnitude the detected hot-switching event, the known calibration voltage may be multiplied by that scale factor. Such an approach may work for any suitable measure of envelope magnitude, such as peak amplitude, average amplitude, or RMS amplitude. Moreover, as described above, a hot-switching event may induce a pattern of signal envelopes at more than one antennae, both during operation of a test system to detect hot-switching and during calibration. In some embodiments, a scale factor may be computed by comparison of patterns of multiple signal envelopes.

According to an aspect, magnitude of a relay hot-switching event may be useful in a number of ways. For example, a higher voltage difference across the relay contacts may generate a higher peak amplitude in signal envelopes picked up by an antenna during hot-switching in the relay. Therefore the magnitude may be used as an indication of the voltage difference during hot-switching. As risk for permanent hardware damage increases with the voltage difference across the relay contacts, a higher hot-switching magnitude may warrant higher degree of concern, and may, in some embodiments, be highlighted so that the cause of the hot-switching is identified and mitigated. In some embodiments, relay hot-switching with a low magnitude may be ignored when the associated voltage difference is not likely to cause significant reliability concerns. A calibration may be performed to correlate the measured peak amplitudes in the signal envelope to voltage difference across a relay during hot-switching, for example, by measuring under conditions in which hot-switching is intentionally introduced with a known voltage difference across the relay.

Peak amplitude measured under these known hot-switching conditions can serve to calibrate the processing apparatus to generate a calibration value that can proportionally convert a measured peak amplitude to voltage across the relay during hot-switching. A calibration value may be generated for a relay and an antenna used for the measurement during calibration. In the example shown in FIG. 5, a calibration value may convert the peak amplitude of 60 mV in signal envelope 534 to a magnitude of 5 V across a relay within relay module 514. As a result, geometric factors such as distance and relative alignment of an antenna relative to a relay may be corrected by the calibration value when interpreting peak amplitude of signal envelopes measured in an antenna. For example, different calibration values may account for differences in scenarios when an antenna measuring hot-switching events from a relay located on the side of a PCB facing away the antenna generates a weaker signal compared to a relay on the antenna-facing side of the PCB, given the same magnitude of the hot-switching event.

According to an aspect, one goal of identifying hot-switching events is to identify instructions in the test job that cause the hot-switching, such that the culprit instructions may be corrected to prevent future hot-switching. An instruction in the test program, changing the state of a relay, may execute at a particular time when a voltage exists across a relay at a particular location. Therefore two analysis of the identified hot-switching event, based on time and location, may help identify the culprit instructions.

To identify culprit instructions by time, the measured time stamp of signal envelopes may be correlated with a time value related to the test instructions. For example, T2 of the onset of signal envelope pulse 534 in FIG. 5 would be correlated to instructions executing at a time corresponding to the same time T2. The correlation may take into account delays between execution of an instruction and actuation of a relay as well as delays between actuation of a relay and detection of electromagnetic radiation indicating a hot-switching event at one or more antennae.

Such a correlation may be performed in any suitable way. In embodiments in which instructions are identifiable with an execution time stamp, correlation may be performed by recording a time stamp for detection of a hot-switching event. The time stamps recorded for test instructions execution and those recorded for hot-switching event detection may be synchronized in any suitable way. As an example, synchronization pulses may be sent with known intervals to start the ADC time-stamps and then mark initial and completion time markers in the measured signal envelopes. The synchronization pulses may be sent when certain test program instructions are being executed. These time stamps enable alignment between the ADC captured values as well as the computer time stamps for program instructions.

Because locations of relays being controlled by a test instruction is generally known, such information may be used in combination with spatial measurements to facilitate identification of culprit instructions that cause hot-switching. In general, hot-switching from a particular relay will generate higher amplitude signal in an antenna that is closer to the relay. Therefore when a hot-switching event detected in multiple antennae will generally show a decaying envelope peak amplitude when measured away from the "epicenter" of the culprit relay. Culprit relays may, for example, be identified as most probably the relays nearest to the location measuring the highest envelope amplitudes. A further comparison using the time stamp of the hot-switching event, in relation to the test instruction time values, may provide a more accurate indication of which relay and which instruction causes hot-switching events. An example of spatial measurement is shown in FIG. 5, where the peak amplitudes in signal envelopes 534, 538, 533, 536, 531 and 535 generally decrease in that order when the antenna location moves farther away from location 4 at the bottom of the figure. In this example, the culprit relay may be identified as most probably one of the relays nearest location 4.

The inventors have recognized and appreciated that each relay within a relay module may be different, and may generate substantially different amplitude of electromagnetic waves during hot-switching. For example, there may be a 10:1 variation between relays on the under-side of a board 210 facing away from the PCB 220 having antennae, compared with relays facing nearby antennae. Therefore a weak peak in the signal envelope does not necessary result from a remote relay from a measuring antenna. To enable recognition of hot-switching events despite such variation, the test system according to an aspect of the present application may apply calibration values determined for each relay in the relay module, such that signal amplitudes picked up by an antenna adjacent particular relays may be scaled by the calibration values. A calibration value may be a gain and/or offset factor applied to measured signal waveforms more accurately report the relay hot-switch level despite differences in strength of the signal picked up by an antenna. These calibration values may be applied to subsequent measurements, such as by the circuitry in FIG. 4. These values may be applied to the analog signals, such as by adjusting the gain of amplifiers 444 or 448 and/or attenuation of attenuator 446. Offsets my similarly be applied in the analog components, but offsets, and other calibration values, may alternatively or additionally be applied in digital processing circuitry.

The calibration values may be determined for relay-antenna pairs using the closest antenna to that relay or for each of multiple close antennae, such as the closest, two, three, four, etc. antennae. Alternatively or additionally, the relay-antenna pairs may be selected for each relay based on the antennae expected to pick up the largest from the relay. Calibration values may be computed from measurements taken under which hot-switching is intentionally induced. The calibration values may be determined as parameters, such as gain and offset, that normalize a signal received from a relay at a particular antenna to a specific peak amplitude and offset. With these calibration values applied to signals picked up during a test, the signals picked up by each antenna may be compared to the same threshold to determine whether the signal picked up at a particular antenna represents a hot switching event at a particular relay.

Calibration values may be determined after taking multiple measurements and averaging, with or without other statistical processing, such as discarding outliers. In some embodiments, the calibration values may be determined by calculation, such as by computing the gain and offset or values of other calibration parameters that normalize a signal. Alternatively or additionally, the calibration values may be determined by adjusting the calibration parameters until the normalized signal results.

In some embodiments, the test job having the same test instructions may be run multiple times to collect a statistical significant sample for relay activities. In a production environment, a test job may be repeated on multiple devices under test successively as those devices are manufactured. Data may be collected over a portion of a production run to indicate that hot-switching occurred. Alternatively or additionally, hot-switching might be detected during qualification of a test program or at any other suitable time in which the test job is run on the same device.

Additionally, the test job may be repeated with the processing circuitry calibrated to detect signals representative of hot-switching events at different relays during different repetitions of the test job.

Alternatively or additionally, processing of signals received from each of multiple antennae may increase confidence in detection of a hot-switching event and/or identify a relay giving rise to a hot-switching event. In some embodiments, the signals measured at each of multiple antennae may indicate which of multiple relays in a test system experienced a hot switching event. Such a determination may be made by using information about the configuration of the test system. The configuration, including locations of relays and antennae and components between the relays and antennae, impacts characteristics of the signal received at an antenna. The impacted characteristics may be, for example, amplitude and timing of the received signal. In some embodiments, the impacted characteristics are the same characteristics for which calibration values are determined. For example, gain and offset calibration values should be inversely related to amplitude and timing of the received signals. This variation is illustrated, for example, in FIG. 5. Hot-switching of a relay near location 4 produced a signal envelope 534 with a relatively large peak amplitude, starting at time T2. Different antennae picked up different signal envelopes 532, 533, 536, 537 and 538 with different peak amplitudes and times of arrival. The pattern of peak amplitude and times of arrival may be correlated to a specific relay near location 4 such that a specific relay may be located by correlating the received signals to known patterns produced for specific relays.

In some embodiments, the known patterns may be determined by a calibration process as described above. Applying the inverse of the calibration values for a specific antenna-relay pair to a measurement at that antenna yields an estimate of the hot-switching signal at the specific relay, if that relay had been responsible for the hot-switching event. By repeating this computation for each of multiple relay-antenna pairs, an estimate of the hot-switching signal at each relay can be made for each of multiple antennae. If a relay is responsible for a hot-switching event, the estimates for each of the multiple antennae should be consistent. A low variance of the estimated hot-switching signal at each relay made for each of multiple antennae indicates the relay likely emitted the hot-switching signal. In some embodiments, the relay for which the lowest such variance is computed may be deemed the relay that caused a hot-switching event. Alternatively or additionally, a low variance, below a threshold, increases a confidence that a hot-switching event occurred, and indication of a hot-switching event, in some embodiments, may be conditioned on a variance below a threshold.

In some embodiments, processing to identify hot-switching may be repeated multiple times to determine whether any of the relays in a test system is hot-switching. In each repetition, the analysis circuitry may be configured based on calibration values for a different specific relay. In this way, hot-switching at each of multiple relays may be simply detected.

Figure 6:
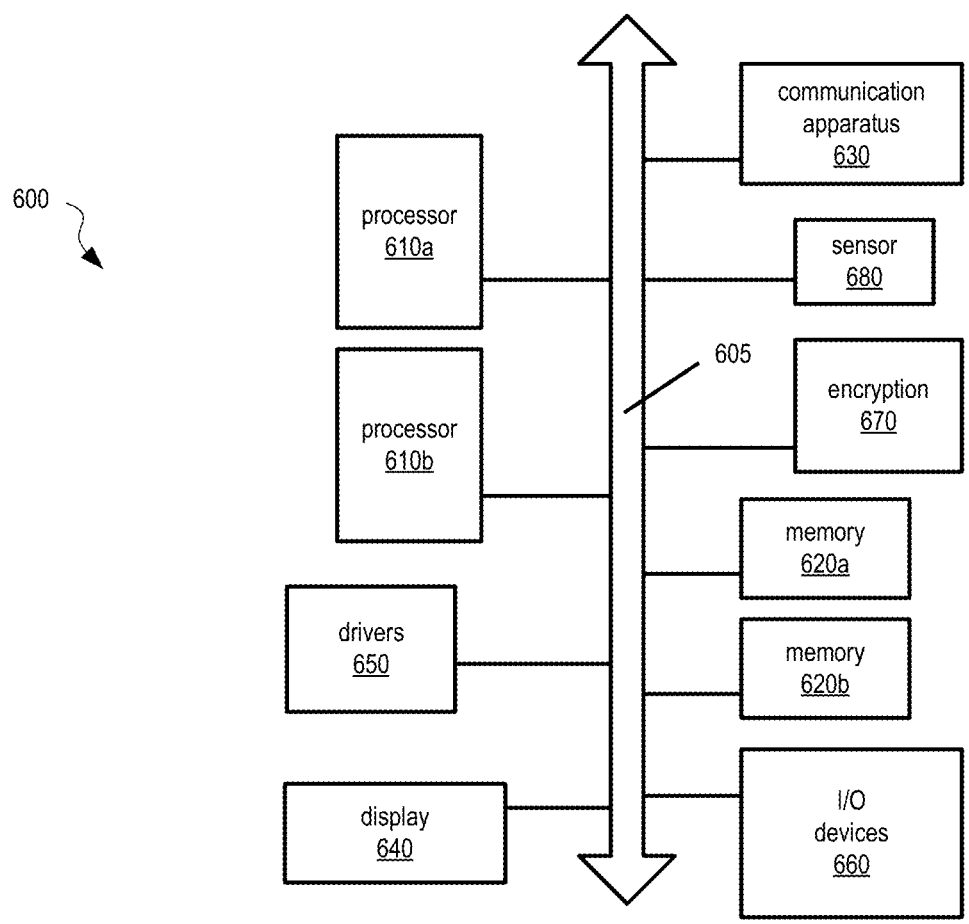
FIG. 6 depicts an example of a computing environment that may be adapted to perform portions of the analysis as described herein, according to some implementations.

Some of the processing and analyzing signal waveforms to identify instructions that cause hot-switching events may be performed on the same PCB as the antennae or may be on a separate printed circuit board connected to the antennae via one or more cables. In other embodiments, some of the processing components may be outside the tester, such as in a computer coupled to the tester through a wired or wireless interface, such as, for example, computer 452 shown in FIG. 4. An example of a computer 600 is depicted in FIG. 6, according to some embodiments. According to some embodiments, a computer may include machine-readable instructions stored in memory that are executed on at least one processor to manage operation of one or more components of the test system.

As an example, a computer 600 may include at least one processor 610 a, 610 b and related hardware. The at least one processor may be configured to control and provide user interaction for operating the device. The at least one processor may be used in combination with memory devices 620 a, 620 b. The memory may include any type and form of RAM-type memory device and ROM-type memory device. A memory device may store machine-readable instructions that can be loaded onto and executed by the at least one processor to specially adapt the at least one processor to perform functionality defined by the machine-readable instructions. When in operation, an operating system may execute on at least one processor and provide for user interaction and operation of an instrument, which may include running multiple software applications and/or programs on the processing system.

According to some embodiments, a processor 610 a, 610 b may comprise any type and form of data processing device, e.g., any one or combination of a microprocessor, microcontroller, a digital signal processor, an application specific integrated circuit (ASIC), and at least one field-programmable gate array (FPGA). There may be more than one processor in the system in some embodiments, e.g., dual core or multi-core processors, or plural processors communicating with at least one controlling processor. In some implementations, there may be a single processor in the processing system.

An instrument that includes the computer 600 may further include a display 640 (e.g., comprising any one or combination of a video monitor, an LCD display, a plasma display, an alpha-numeric display, LED indicators, etc.). The instrument may further include one or more input/output devices 660 in some embodiments (e.g., keyboard, touchpad, buttons, switches, touch screen, microphone, speaker, printer), and communication apparatus 630 (e.g., networking software, networking cards or boards, wireless transceivers, and/or physical sockets). The instrument may include device drivers, e.g., software modules specifically designed to execute on the one or more processor(s) and adapt the processor(s) to communicate with and control system components. In some embodiments, the processing system may include encryption/decryption hardware and/or software 670 that may be used to encrypt selected outgoing data transmissions and decrypt incoming encrypted data transmissions. Components of an instrument in which the processing system is located may communicate over a bus 605 that carries data and control signals between the components. The bus may provide for expansion of the system to include other components not shown in FIG. 6.

Figure 7A:
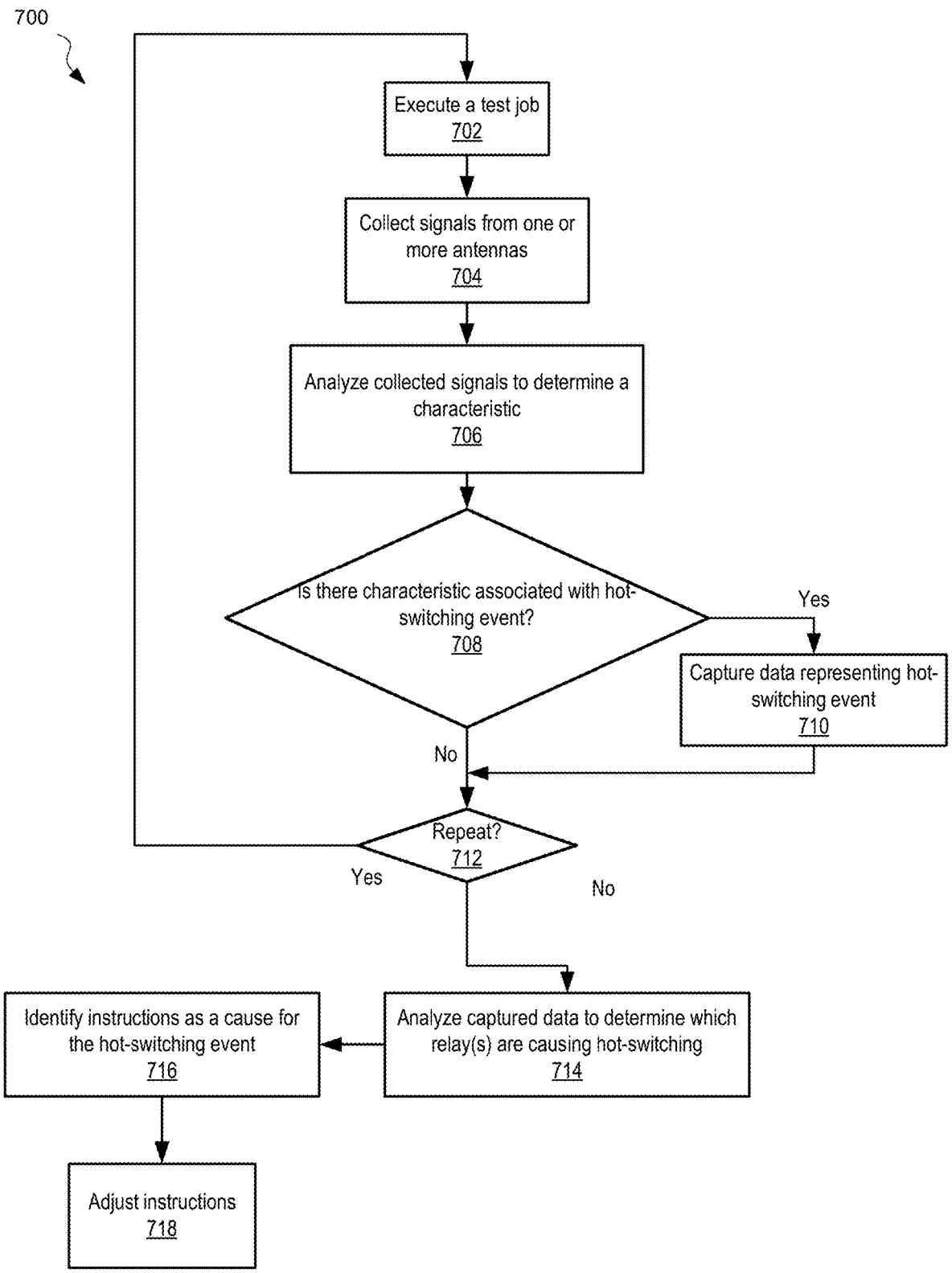
FIG. 7A is a flow chart of a method for operating a test system for hot-switching detection, in accordance with some embodiments.

The technology described herein may be embodied as a method. FIG. 7A is a flow chart of a method 700 for operating a test system for hot-switching detection, in accordance with some embodiments. As shown in FIG. 7A, method 700 begins at act 702 by executing a test job having instructions to control a plurality of relays in the test system to open or close. At act 704, signals from one or more antennae placed adjacent the plurality of relays are collected. The signals may represent ringing induced by electromagnetic emissions during hot-switching events from the relays. The collected signals are analyzed at act 706 to determine a characteristic of the collected signals. The analyzing may be performed using any of the techniques as described in embodiments above, including but not limited to with an analysis circuitry 300 as shown in FIG. 3. If it is determined at act 708 that a characteristic associated with hot-switching is present, captured data such as the time stamp of the hot-switching event and a corresponding relay location may be captured and saved, such as in a computer. The method at act 712 may go back to the test job execution at 702 and repeat hot-switching detection as described in acts 702-708, to test a full range of instructions written in the test program for the test job. In some embodiments, the same test job may be repeated more than once, to create a statistical picture of hot-switching events. In some embodiments, components in an analysis circuitry 300 may have their setting parameters readjusted during a repeat, such that a gain/offset setting for a new antenna/relay pair will be selected during acts 704 and 706. At act 714, upon collection of data for all relays, data representing hot-switching events detected are analyzed at act 714 for each of multiple relays to determine which of relay or relays was the source of the hot switching. At act 716, the method identifies the particular instructions in the executed test job as a cause for the hot-switching event, by for example comparing time stamps of the hot-switching event, locations of the hot-switching relays, with execution times of the instructions. Once cause for hot-switching is identified, the instructions may be adjusted at act 718, by for example rewriting the instructions to maintain both contacts of each relay are of the same voltage potential prior to the relay switching.

Figure 7B:
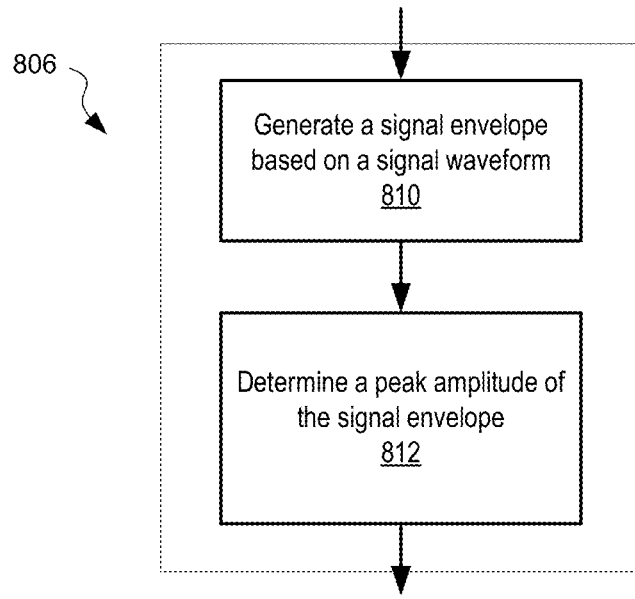
FIG. 7B is a flow chart of a method for operating a test system for hot-switching detection, in accordance with some embodiments.

FIG. 7B is a flow chart of a method 806 that is an exemplary implementation of act 706 as shown in FIG. 7A, according to some embodiments. In act 810, each collected signal waveforms may be analyzed, for example using analysis circuitry 300 of FIG. 3, to generate a signal envelope based on the signal waveform. The signal envelope is further processed to determine a peak amplitude as the characteristic that is associated with a hot-switching event.

Figure 7C:
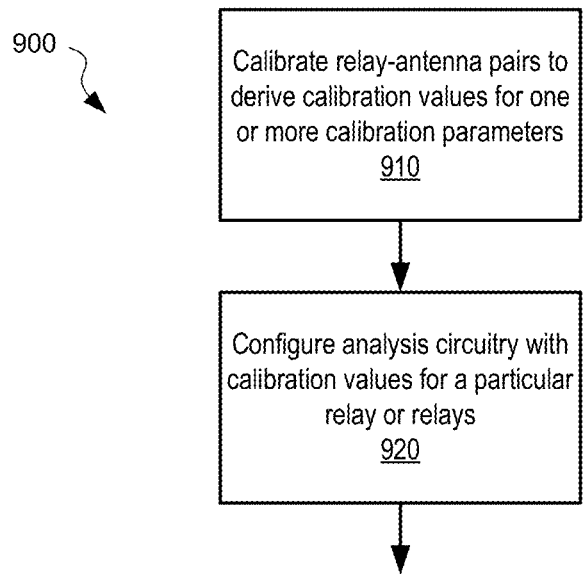
FIG. 7C is a flow chart of a method that is an exemplary calibration method, in accordance with some embodiments.

Additional calibrations may be performed by an operator prior to operating the test system for hot-switching detection. FIG. 7C is a flow chart of a method 900 that is an exemplary calibration method, according to some embodiments. At act 910, relay-antenna pairs are measured to derive calibration values for one or more calibration parameters, such as by measuring signal envelopes corresponding to emissions from relays closest to an antenna, when the relays are intentionally instructed to exhibit hot-switching. Calibration values, such as gain and offset, that normalize a signal received from a relay at a particular antenna to a specific peak amplitude may be determined at this act. Subsequently, at act 920, an analysis circuitry may be configured with the determined calibration values, prior to beginning of the hot-switching detection operation in the method 700.

The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art.

For example, processing is described in connection with a single antenna. Similar processing may be performed for each of multiple antennae. The processing, for example, may enable detection of hot-switching events in relays installed over a wider area than could be detected with a single antenna. Alternatively or additionally, signals output from multiple antennae may be used to more reliably detect a hot-switching event by correlating signals such that a hot-switching event is indicated when multiple antennae detect the same signal characteristic of a hot-switching event.

As another example, it was described that hot-switching of relays on a single assembly 200 was identified. A test system may include multiple assemblies with relays and the processing as described herein may be performed for each such assembly. Such processing may be performed in parallel or may be performed sequentially.

As yet another example, hot switching was described as being detected to identify instructions in a test system program that caused unintended hot-switching. Such processing was described as enabling changes of the test program. Such information may be used for other purposes, such as to track the number of hot-switching cycles that a relay is exposed to and to plan maintenance of a test system accordingly.

Further, processing was described to identify a specific relay of a plurality of relays that is hot-switching at a specific time. In some embodiments, an indication that a relay hot-switched during a test job or at a particular time during a test job, without an identification of a specific relay that hot-switched may be useful. In such an embodiment, analysis to identify a specific relay may be omitted.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for detecting mechanical relay hot-switching events in a test system comprising a plurality of relays at corresponding relay locations, the method comprising:
    measuring, with one or more antennae, one or more signal waveforms representing electromagnetic emissions from one or more relays of the plurality of relays;
    analyzing the one or more signal waveforms measured with the one or more antennae to determine whether at least one of the one or more signal waveforms has a characteristic associated with a hot-switching event;
    based on determining that at least one of the one or more signal waveforms has a characteristic associated with a hot-switching event, identifying a time corresponding to the hot-switching event.

2. The method of claim 1, wherein analyzing the one or more signal waveforms comprises selectively generating a signal envelope of a component of each of the one or more signal waveforms based on the component having a frequency at a ringing frequency of the antenna.

3. The method of claim 1, further comprising:
    controlling switching of the plurality of relays in accordance to a plurality of test system instructions each having an execution time; and
    based on the identified time corresponding to the hot-switching event, identifying one or more instructions of the plurality of test system instructions as a cause for the hot-switching event.

4. The method of claim 3, wherein:
    the act of identifying a time corresponding to the hot-switching event comprises recording a time stamp corresponding to the hot-switching event;
    each of the plurality of test system instructions has an execution time stamp; and
    the act of identifying one or more instructions as a cause for the hot-switching event comprises:
        comparing the time stamp with execution time stamps of the plurality of test system instructions, and
        identifying one or more instructions as a cause for the hot-switching event based on comparing the time stamp with execution time stamps.

5. The method of claim 3, wherein:
    the plurality of test system instructions are associated with relays at one or more relay locations, and wherein the act of identifying one or more instructions as a cause for the hot-switching event further comprises:
        identifying a relay location corresponding to the hot-switching event,
        selecting instructions as the one or more identified instructions based on the instructions having associated relay locations proximate to the relay location corresponding to the hot-switching event.

6. The method of claim 2, wherein:
    analyzing the one or more signal waveforms to determine whether at least one of the one or more signal waveforms has a characteristic associated with a hot-switching event comprises analyzing the generated signal envelopes to determine whether at least one of the generated signal envelopes has a characteristic associated with a hot-switching event.

7. The method of claim 6, wherein the characteristic associated with a hot-switching event is a peak amplitude or a pulse width of the one or more generated signal envelopes.

8. The method of claim 7, wherein at least one of the signal envelopes has a pulse width of at least 1 ns.

9. The method of claim 6, further comprising digitizing the generated signal envelopes by sampling the signal envelopes at a sampling period between 0.1 ns and 1 ns.

10. The method of claim 2, wherein analyzing the one or more signal waveforms further comprises:
    analyzing the plurality of signal waveforms to determine a magnitude of a hot-switching event by:
        correlating a pattern of the magnitudes of the generated signal envelopes associated with the plurality of antennae with each of a plurality of predetermined patterns of signal envelopes detected upon switching each a respective plurality of relays;
        identifying a relay undergoing a hot-switching event based on the correlation;
        determining a scale factor between a magnitude of an envelope associated with a reference hot-switching event of the identified relay and at least one of the magnitudes of the detected envelopes; and
        computing the magnitude of the hot-switching event based on the scale factor and a magnitude of the reference hot-switching event.

11. A test system, comprising:
a printed circuit board (PCB);
a plurality of relays on the PCB;
one or more antennae each disposed adjacent one or more relays of the plurality of relays, each of the one or more antennae is configured to measure one or more signal waveforms representing electromagnetic emissions from the one or more relays;
circuitry configured to analyze the one or more signal waveforms measured by the one or more antennae to determine whether at least one of the one or more signal waveforms has a characteristic associated with a hot-switching event.

12. The test system of claim 11, further comprising:
an envelope detector circuit configured to generate a signal envelope based on each of the one or more signal waveforms; wherein
the one or more processors are configured to analyze the generated signal envelopes to determine whether at least one of the generated signal envelopes has a characteristic associated with a hot-switching event.

13. The test system of claim 12, wherein the PCB is a first PCB, and the test system further comprises a second PCB, wherein the one or more antennae are disposed on the second PCB.

14. The test system of claim 13, wherein the envelope detector circuit is disposed on the second PCB.

15. The test system of claim 13, wherein the circuitry comprises a field programmable gate array (FPGA), and the test system further comprises an analog to digital converter (ADC) disposed on the second PCB and coupled between an output of the envelope detector circuit and the FPGA.

16. The test system of claim 13, wherein the plurality of relays are disposed on a first surface of the first PCB, the one or more antennae are disposed on a second surface of the second PCB, and wherein the first PCB is mechanically coupled to the second PCB such that the first surface faces the second surface.

17. The test system of claim 13, further comprising a test system enclosure having a plurality of slots, wherein the first PCB and second PCB are disposed in a slot of the plurality of slots.

18. A method of operating a test system to detect hot-switching events, the method comprising:
controlling switching of relays of a plurality of relays in the test system in accordance with a plurality of instructions;
measuring, with one or more antennae, one or more signal waveforms representing electromagnetic emissions from one or more relays;
analyzing the one or more signal waveforms to determine whether at least one of the one or more signal waveforms has a characteristic associated with a hot-switching event;
based on determining that at least one of the one or more signal waveforms has a characteristic associated with a hot-switching event, identifying one or more instructions of the plurality of instructions as a cause for the hot-switching event.

19. The method of claim 18, wherein
controlling switching of the plurality of relays in accordance to the plurality of instructions comprises controlling switching of the plurality of relays at a plurality of execution times each associated with an instruction of the plurality of instructions, and the act of identifying one or more instructions as a cause for the hot-switching event further comprises further comprises:
identifying a time corresponding to the hot-switching event;
comparing the identified time with execution times associated with the plurality of instructions;
identifying one or more instructions as a cause for the hot-switching event based on comparing the time with execution times.

20. The method of claim 18, wherein each of the plurality of instructions is associated with relays at one or more relay locations, and wherein the act of identifying one or more instructions as a cause for the hot-switching event further comprises:
identifying a relay location corresponding to the hot-switching event,
comparing the relay location with relay locations associated with the plurality of instructions, and
based on comparing the relay location with relay locations associated with the plurality of instructions, identifying one or more test sequences as a cause for the hot-switching event.

* * * * *